United States Patent
Hino et al.

(10) Patent No.: US 6,849,947 B2
(45) Date of Patent: Feb. 1, 2005

(54) SEMICONDUCTOR DEVICE AND PATTERN LAYOUT METHOD THEREOF

(75) Inventors: Yoshinori Hino, Gunma (JP); Naoei Takeishi, Niigata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/080,831

(22) Filed: Feb. 21, 2002

(65) Prior Publication Data
US 2002/0125474 A1 Sep. 12, 2002

(30) Foreign Application Priority Data
Feb. 28, 2001 (JP) .................................. P 2001-053627

(51) Int. Cl.⁷ .......................... H01L 23/48; H01L 23/52
(52) U.S. Cl. ...................... 257/758; 257/750; 257/724; 257/732; 257/204; 257/206; 257/211; 716/8; 716/11; 365/186
(58) Field of Search ............................. 257/758, 750, 257/724, 732, 204, 206, 211, 48; 716/8, 11; 365/186, 185.13, 82

(56) References Cited

U.S. PATENT DOCUMENTS

| | | | |
|---|---|---|---|
| 6,522,003 B1 * | 2/2003 | Minami et al. | 257/758 |
| 6,614,120 B2 * | 9/2003 | Sato et al. | 257/758 |
| 6,742,169 B2 * | 5/2004 | Haraguchi et al. | 716/8 |
| 2001/0048104 A1 * | 12/2001 | Miyajima et al. | 257/48 |

* cited by examiner

Primary Examiner—Jerome Jackson
Assistant Examiner—Joseph Nguyen
(74) Attorney, Agent, or Firm—Fish & Richardson P.C.

(57) ABSTRACT

The semiconductor device of the invention includes transistors for a driver and dummy patterns formed to be adjacent to the end portion of each output bit group constituting a cathode driver, anode drivers and anode drivers.

14 Claims, 12 Drawing Sheets

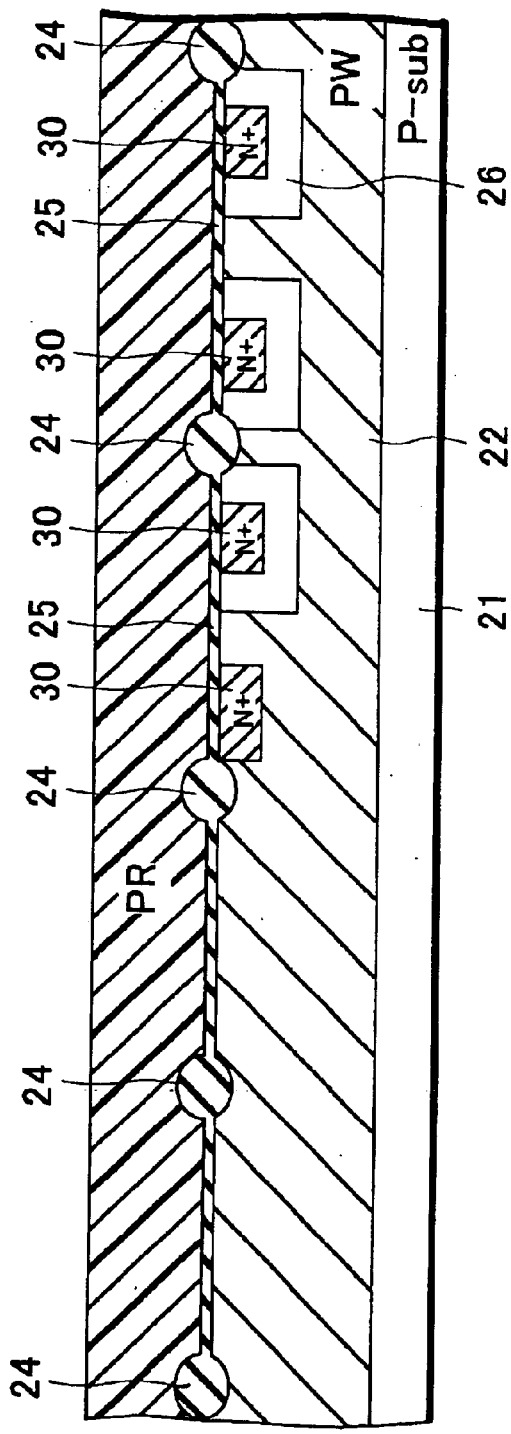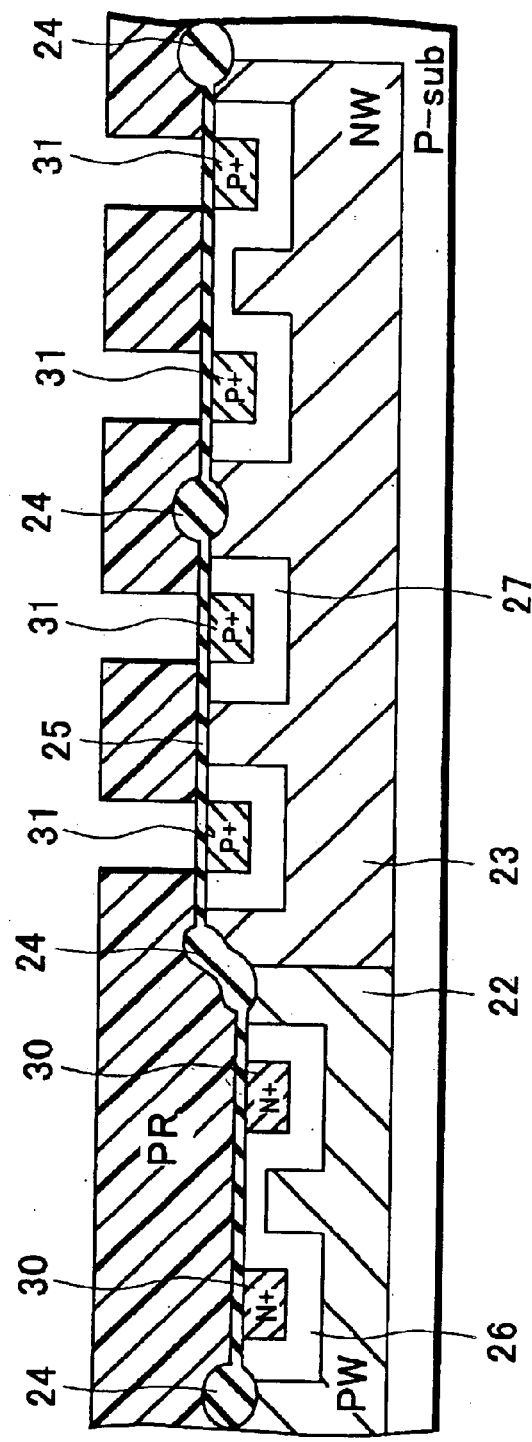

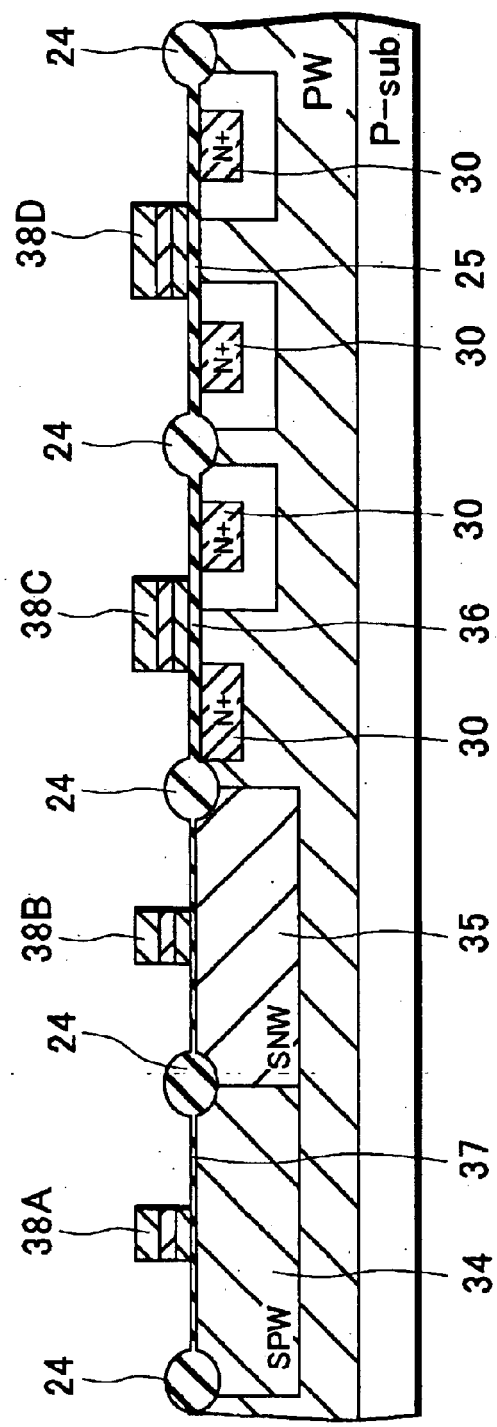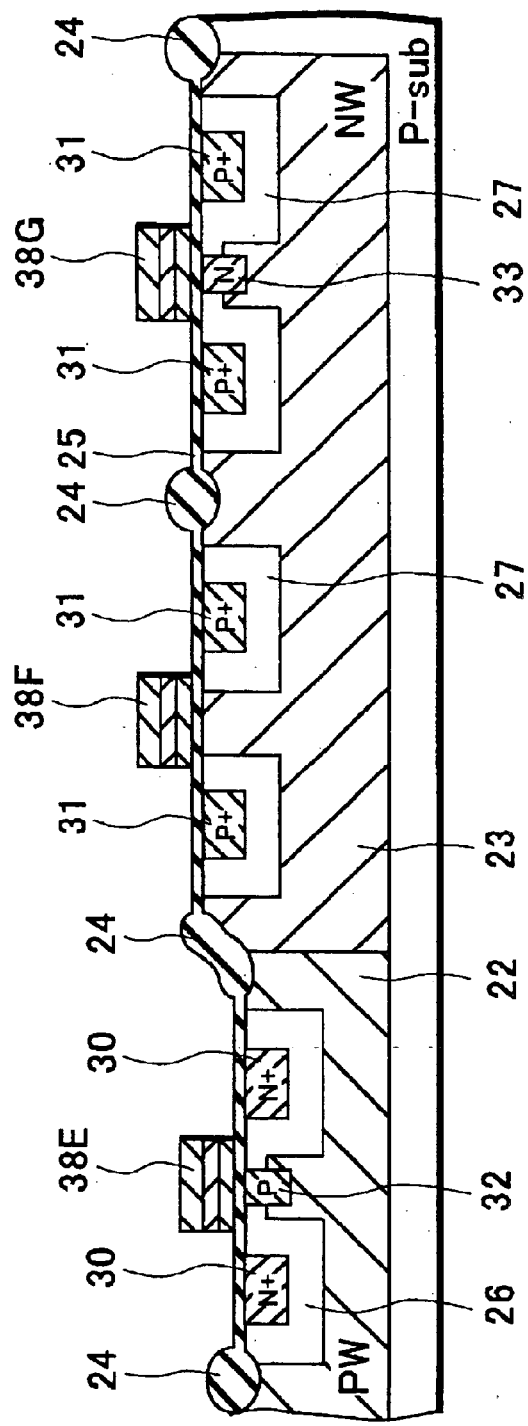

FIG.10A
FIG.10B
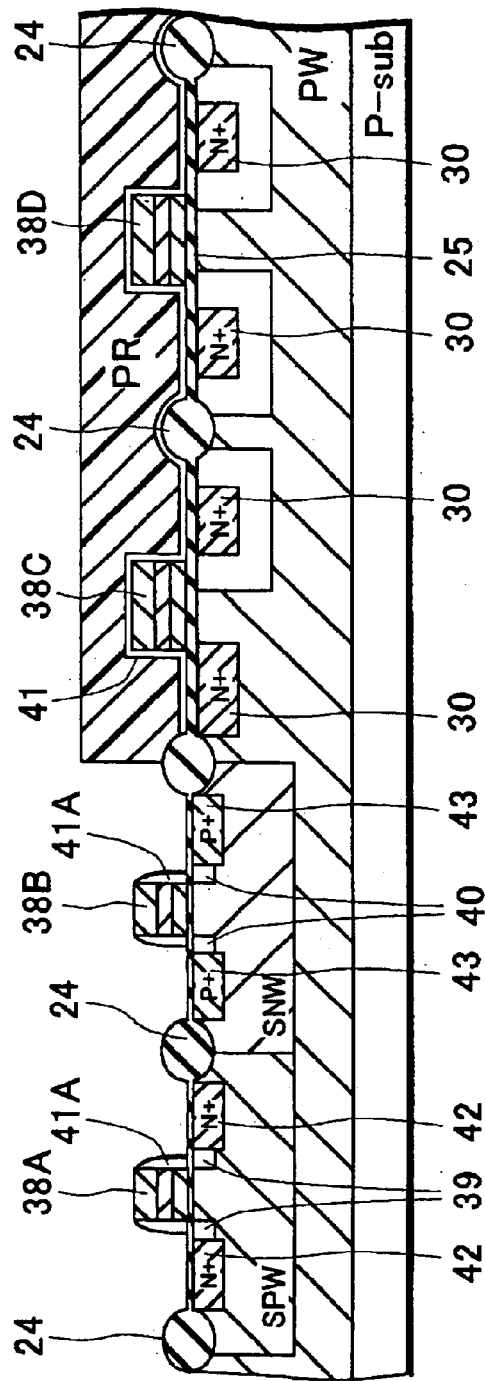
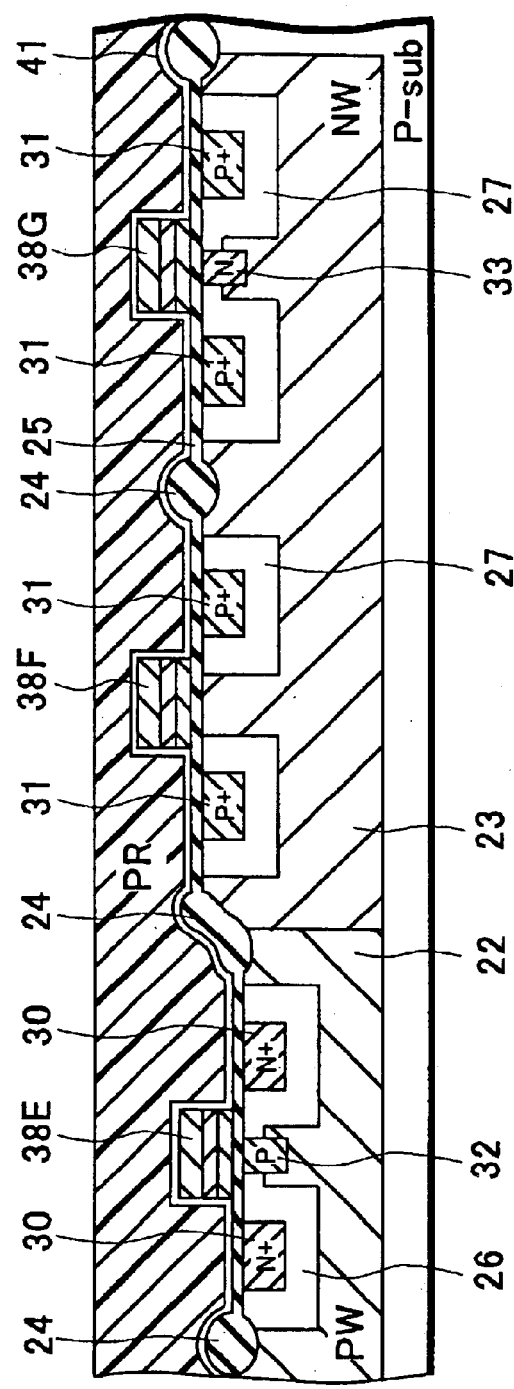

SEMICONDUCTOR DEVICE AND PATTERN LAYOUT METHOD THEREOF

BACKGROUND OF THE INVENTION

The present invention relates to a semiconductor device and a pattern layout method thereof, particularly a pattern layout construction of a display driver and the like having an anode driver and a cathode driver for example and making them in one chip, and pattern layout method thereof.

A semiconductor device constituting the above-mentioned display driver and the like will be described referring a drawing.

In the above-mentioned display, there are various kinds of flat panel displays such as an LCD, an LED display, an organic EL (Electroluminescence) display, an inorganic EL display, a PDP (Plasma Display Panel), an FED (Field Emission Display), and so on.

An organic EL display driver will be described below as an example, which has an anode driver and a cathode driver for example, supplies constant current to the organic EL element, and makes the organic EL element emit light. Since the EL element has many merits such that a back light required in a liquid crystal display is not necessitated because of self-luminescence and that there is not limit about visual field angle, application for display device of next generation is expected. Especially, it is known that the organic EL element is possible in high brightness and superior than an inorganic EL element in high efficiency, high response characteristic, and multiple color.

The above-mentioned organic EL display driver includes logic N-channel MOS transistor and P-channel MOS transistor, N-channel high-voltage MOS transistor and P-channel high-voltage MOS transistor of high withstand voltage, N-channel high-voltage MOS transistor and P-channel high-voltage MOS transistor of high withstand voltage reduced in on-resistance, N-channel MOS transistor for a level shifter, and so on. Here, a DMOS (Double-diffused Metal-Oxide Semiconductor) transistor and the like are used for the high-voltage MOS transistor reduced in on-resistance for example. In the above-mentioned DMOS transistor construction, new diffusion region is formed by diffusing impurity different in conductive type to diffusion region formed at surface side of semiconductor substrate and difference of vertical direction diffusion of these diffusion regions is used as effective channel length so that the transistor is an element suitable for low on-resistance by forming short channel.

A pattern layout of a semiconductor device at constituting various kinds of drivers such as the above-mentioned the organic EL display driver has constitution where required numbers of output of layouts for one bit output are arranged repeatedly.

That is, FIG. 13 is a sectional view showing a pattern layout of a semiconductor device for driver, and required numbers of output of layouts for one bit output are arranged repeatedly.

Here, numeral 1 in FIG. 13 denotes output region corresponding to one bit, and a driver portion where the plural output regions 1 for one bit are arranged so as to have desired numbers of output is constituted. Numeral 2 denotes wiring for gate electrode formed in the output region 1, and source region (S) and drain region (D) are formed so as to be adjacent to the wiring for gate electrode 2. (See enlarged view in the circle in FIG. 13.)

Here, a problem of variation between bits rises as multi bits advance. That is, the variation between bits causes to generate micro-loading effect by difference between fineness and roughness of gate electrode forming pattern, and occasionally finishing shape and working dimension of the gate electrode go wrong by the effect.

Especially, when the organic EL display driver having the anode driver, the cathode driver, and the like as above-mentioned are made in one chip, each driver portion is mounted mixedly naturally. Therefore, the above-mentioned difference between fineness and roughness of the gate electrode forming pattern becomes large, micro-loading effect generates easily at photolithography and etching, variation of finishing shape and working dimension of the gate electrode caused by the effect becomes large, and being out of order in display generates.

SUMMARY OF THE INVENTION

According to the present invention, a semiconductor device and a pattern layout method thereof arranged with plural output bits includes a dummy pattern having the same shape as the output bits formed to be adjacent to the end portion of the output bit group.

Preferably, the semiconductor constitutes each transistor for a driver and the each dummy pattern is formed to be adjacent to the end portion of the output bit group constituting a cathode driver, an anode driver, and an anode driver for icon.

Further, the dummy pattern is formed at an empty space in a region where said plural output bits are arranged.

Moreover, number of outputs of the dummy pattern formed at a region where output bit groups constituting the cathode driver, the anode driver, and the anode driver for icon are adjacent each other is less than number of outputs of the dummy pattern formed at a region where output bit groups are not adjacent each other.

Further, the dummy pattern has the same shape as wiring for gate electrode.

BRIEF DESCRIPTION OF THE DRAWINGS

FIGS. 4A and 4B are sectional views showing a method for manufacturing a semiconductor device according to the embodiment of the invention;

FIGS. 8A and 8B are sectional views showing a method for manufacturing a semiconductor device according to the embodiment of the invention;

FIGS. 10A and 10B are sectional views showing a method for manufacturing a semiconductor device according to the embodiment of the invention;

DETAILED DESCRIPTION OF THE PREFERRED EMBODIMENT

An embodiment of the invention according to a semiconductor device and a pattern layout method thereof will be described below with reference to the drawings. In this embodiment, an organic EL display is shown as an example, and a semiconductor device mounted with various kinds of MOS transistors constituting the organic EL display driver is described.

The organic EL display driver is configured with, as viewed from the left in FIG. 10A, logic N-channel MOS and P-channel MOS transistors (e.g. on 3 V), an N-channel MOS transistor (e.g. on 30 V) for a level shifter and an N-channel high-voltage MOS transistor of high withstand voltage (e.g. on 30 V) and, as viewed from the left in FIG. 10B, an N-channel high-voltage MOS transistor of high withstand voltage (e.g. on 30 V) reduced in on-resistance, a P-channel high-voltage MOS transistor of high withstand voltage (e.g. on 30 V) and a P-channel high-voltage MOS transistor of high withstand voltage (e.g. on 30 V) reduced in on-resistance. Note that, in the below explanation, the MOS high-voltage transistor reduced in on-resistance is referred to as an SLED (Slit channel by counter doping with extended shallow drain) MOS transistor in order to differentiate between the high-voltage MOS transistor and the high-voltage MOS transistor reduced in on-voltage, for the sake of explanation.

In the semiconductor device mounted with various MOS transistors constituting such an organic EL display driver, as shown in FIGS. 10A and 10B, an N type well region 23 forming the P-channel high-voltage transistor and the P-channel high-voltage SLEDMOS transistor reduced in on-resistance is configured in a step higher region, while a P type well region 22 forming the other MOS transistors is configured in a step lower region. In other words, structuring is made to arrange the precise logic (e.g. 3V) N-channel MOS and P-channel MOS transistors in the step lower region.

Explanation is made below on a method of manufacturing a semiconductor device mounted with various transistors constituting the display driver described above.

Figure 1A:
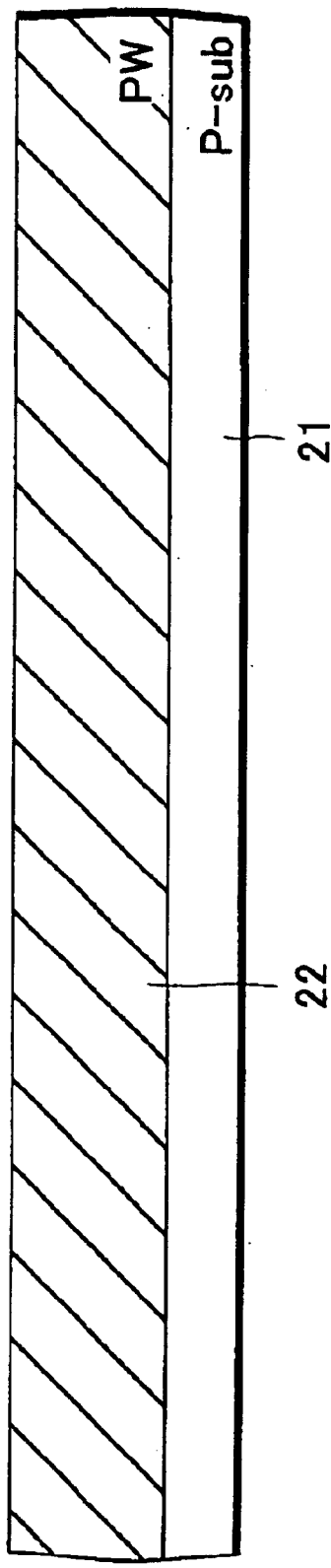
FIGS. 1A and 1B are sectional views showing a method for manufacturing a semiconductor device according to the embodiment of the invention.
Figure 1B:
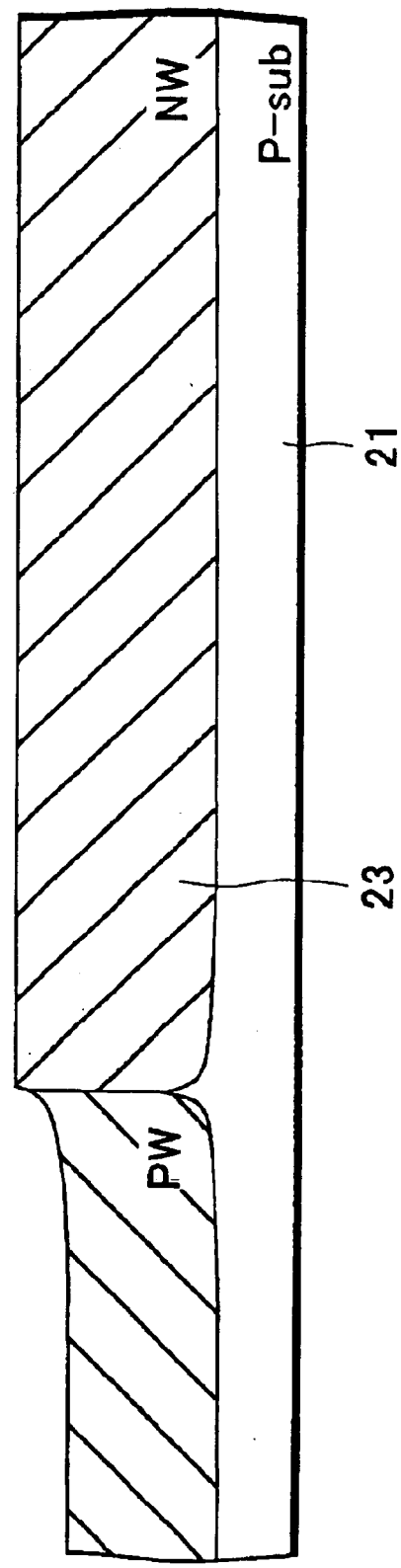

In FIGS. 1A and 1B, in order to define a region for forming various MOS transistors, a P type well (PW) 22 and an N type well (NW) 23 are first formed using LOCOS technique, e.g. in a p type semiconductor substrate (P-sub).

That is, although explanation with showing is omitted, a pad oxide film and a silicon nitride film are formed on the well region of the semiconductor substrate 21. The pad oxide film and silicon nitride film is used as a mask to ion-implant boron ion, for example, at an acceleration voltage of approximately 80 keV and a dose of $8 \times 10^{12}/cm^2$, thereby forming an ion-implant region. Thereafter, the silicon nitride film is used as a mask to oxidize the substrate surface by the LOCOS technique, thereby forming a LOCOS film. At this time, the boron ion implanted in a region beneath the LOCOS film is diffused toward the inward of the substrate to form a P type region Next, the pad oxide film and the silicon nitride film are removed. Thereafter, the LOCOS film is used as a mask to ion-implant phosphorus ion to the substrate surface, at an acceleration voltage of approximately 80 keV and a dose of $9 \times 10^{12}/cm^2$, thereby forming an ion-implant region 15. Then, the LOCOS film is removed away. Thereafter, the impurity ions implanted in the substrate are thermally diffused to form a P type well and N type well. Thus, as shown in FIGS. 1A and 1B, the P type well 22 formed in the substrate 21 is arranged in a step lower region while the N type well is arranged in a step higher region.

Figure 2A:
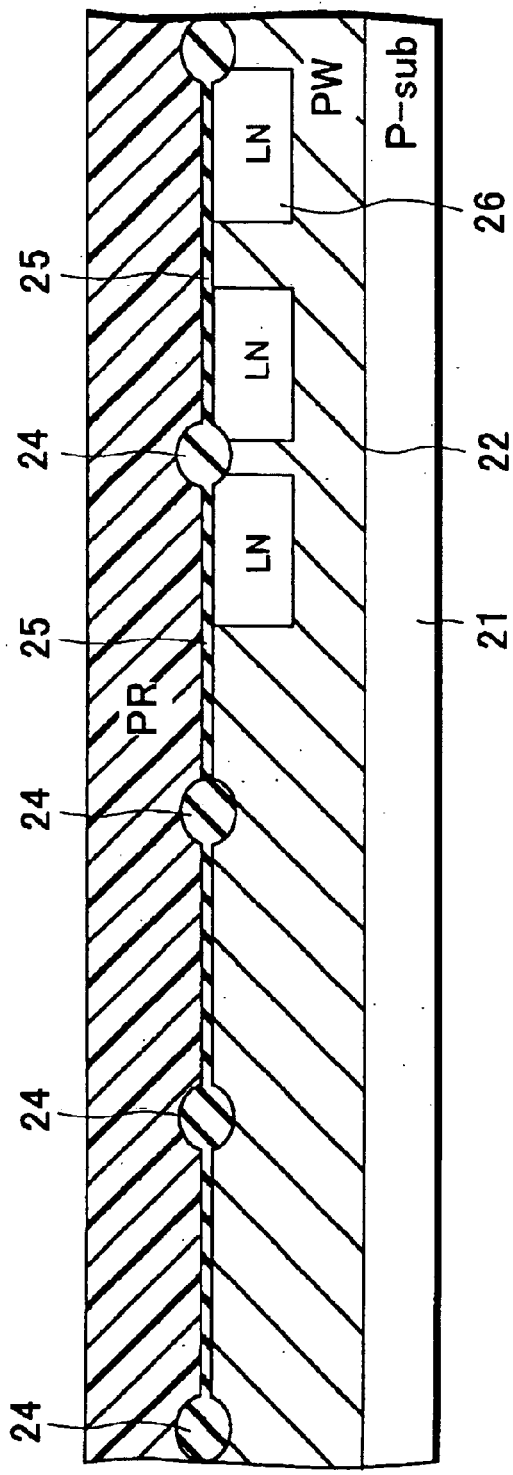
FIGS. 2A and 2B are sectional views showing a method for manufacturing a semiconductor device according to the embodiment of the invention.
Figure 2B:
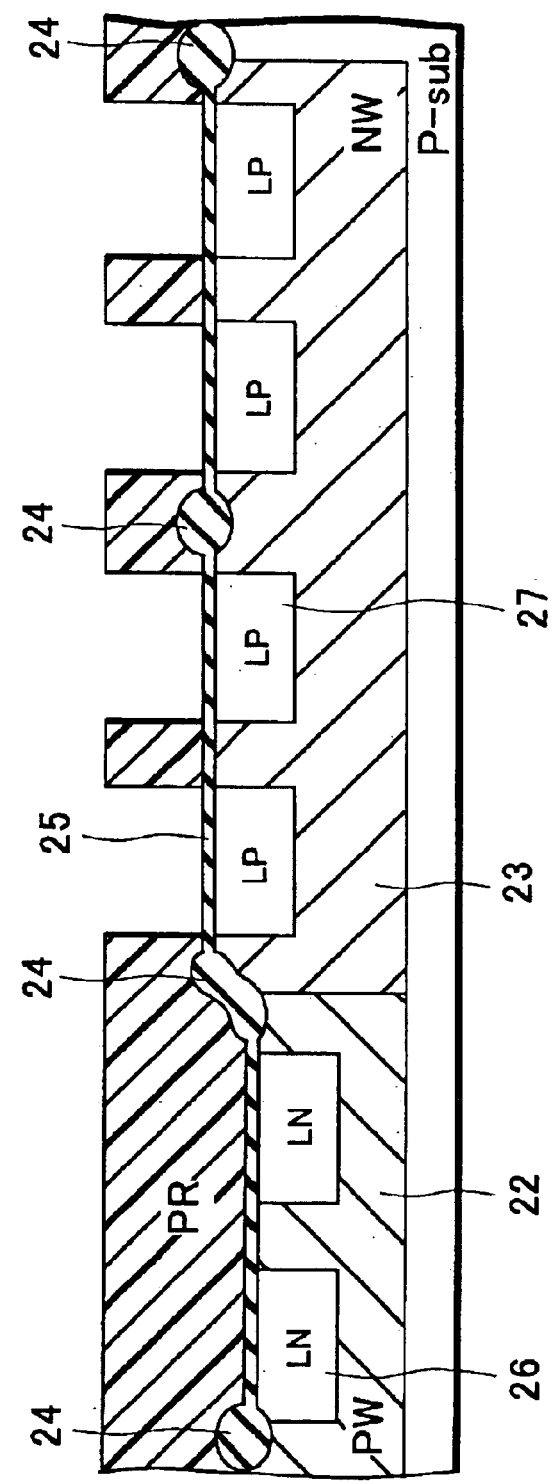

Next, in FIGS. 2A and 2B, a device isolation film 24 is formed to an approximately 500 nm by the LOCOS process in order for device isolation based on the MOS transistor. A thick gate oxide film 25 for withstanding high voltage is formed by thermal oxidation in a thickness of approximately 80 nm on an active region excepting the device isolation region.

Subsequently, the resist film is used as a mask to form first low-concentration N type and P type source/drain regions (hereinafter, referred to as LN region 26, LP region 27). Namely, in a state covering the region of other than an LN region by a not-shown resist film, phosphorus ion, for example, is first ion-implanted to the substrate surface layer at an acceleration voltage of 120 keV and a dose of $8 \times 10^{12}/cm^2$ thereby forming an LN region 26. Thereafter, in a state covering the region of other than an LP region by a resist film (PR), boron ion, for example, is ion-implanted to the substrate surface layer at an acceleration voltage of 120 keV and a dose of $8.5 \times 10^{12}/cm^2$ thereby forming an LP region 27. Note that, in actual, the implanted ionic species will be thermally diffused into a LN region 26 and LP region 27 through an anneal process as a later process (e.g. in an $N_2$ atmosphere at 1100° C. for 2 hours).

Figure 3A:
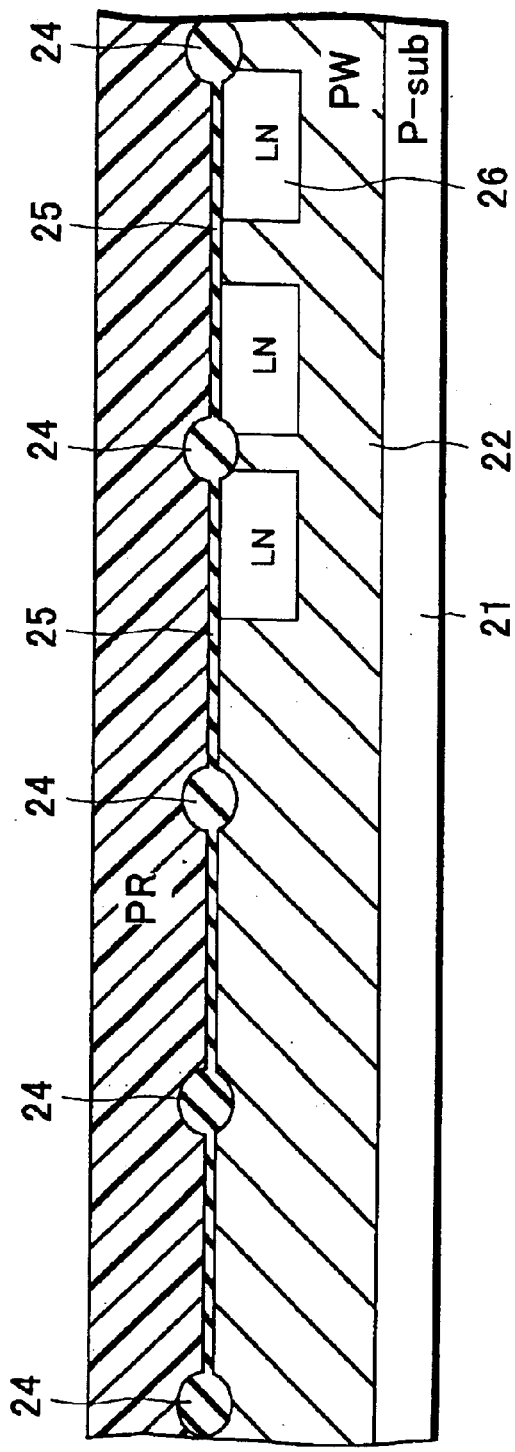
FIGS. 3A and 3B are sectional views showing a method for manufacturing a semiconductor device according to the embodiment of the invention.
Figure 3B:
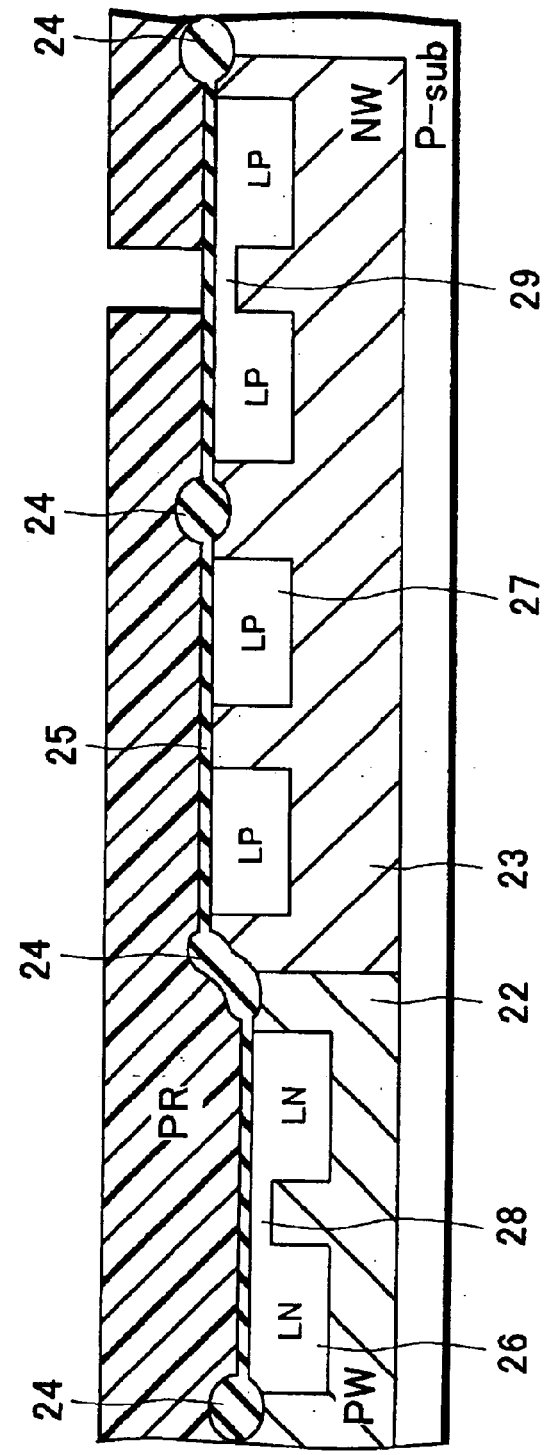

Subsequently, in FIGS. 3A and 3B, using as a mask a resist film at between the LN regions 26 and the LP regions 27 forming the regions for P-channel and N-channel SLED-MOS transistors, second low-concentration N type and P type source/drain regions (hereinafter, referred to as SLN region 28 and SLP region 29) are formed. Namely, in a state covering the region other than the region for an SLN region by a not-shown resist mask, phosphorus ion, for example, is first ion-implanted to the substrate surface layer at an acceleration voltage of 120 keV and a dose of $1.5 \times 10^{12}/cm^2$ to form an SLN region 28 continuing the LN regions 26. Then, in a state covering the other region of the SLP region by a resist film (PR), boron difluoride ($^{49}BF_2^+$), for example, is ion-implanted to the substrate surface region at an acceleration voltage of 140 keV and a dose of $2.5 \times 10^{12}/cm^2$ to form an SLP region 29 continuing the LP regions 27. Note that the LN region 26 and the SLN region 28 or the LP region 27 and the SLP region 29 are set nearly equal in impurity concentration or higher in either one.

Furthermore, in FIGS. 4A and 4B, a resist film is used as a mask to form high-concentration N type and P type source/drain regions (hereinafter, referred to as N+ region 30, P+ region 31). Namely, in a state covering the other region than a region for an N+ region by a not-shown resist film, phosphorus ion, for example, is first ion-implanted to the substrate surface layer at an acceleration voltage of 80 keV and a dose of $2\times10^{15}/cm^2$ thereby forming an N+ region 30. Thereafter, in a state covering the other region than a region for a P+ region by a resist film (PR), boron difluoride ion, for example, is ion-implanted to the substrate surface layer at an acceleration voltage of 140 keV and a dose of $2\times10^{15}/cm^2$ thereby forming a P+ region 31.

Figure 5A:
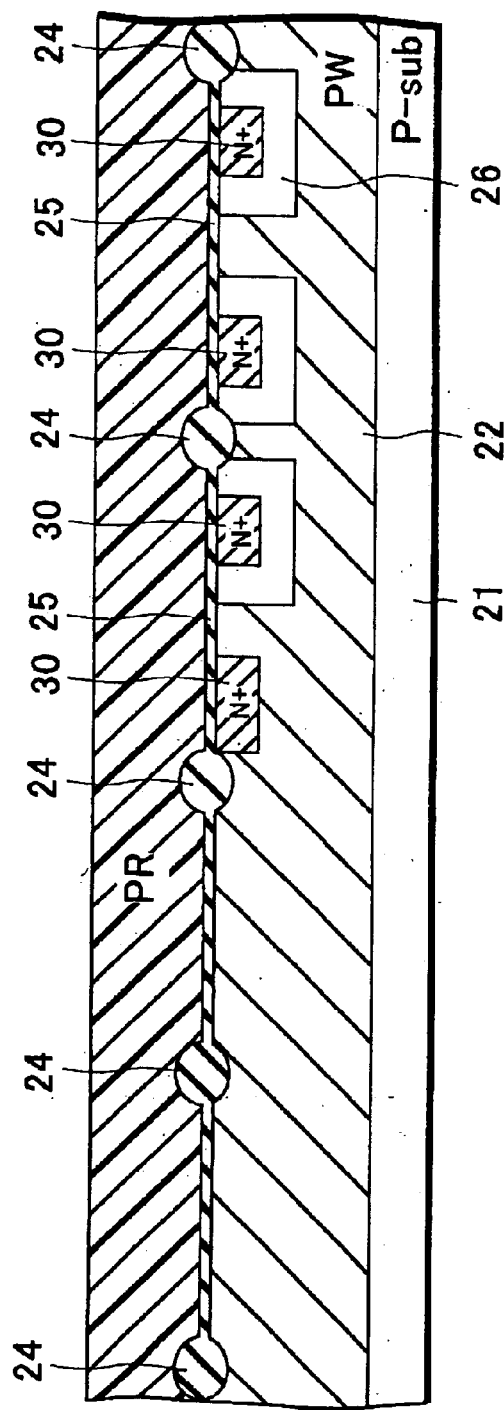
FIGS. 5A and 5B are sectional views showing a method for manufacturing a semiconductor device according to the embodiment of the invention.
Figure 5B:
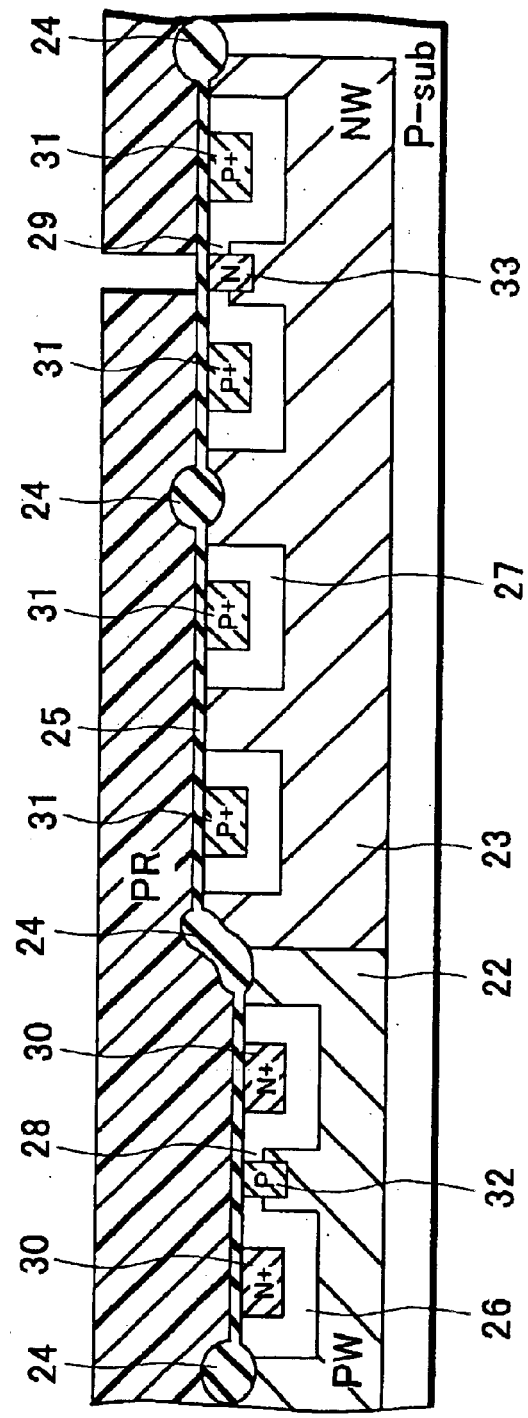
Figure 13:
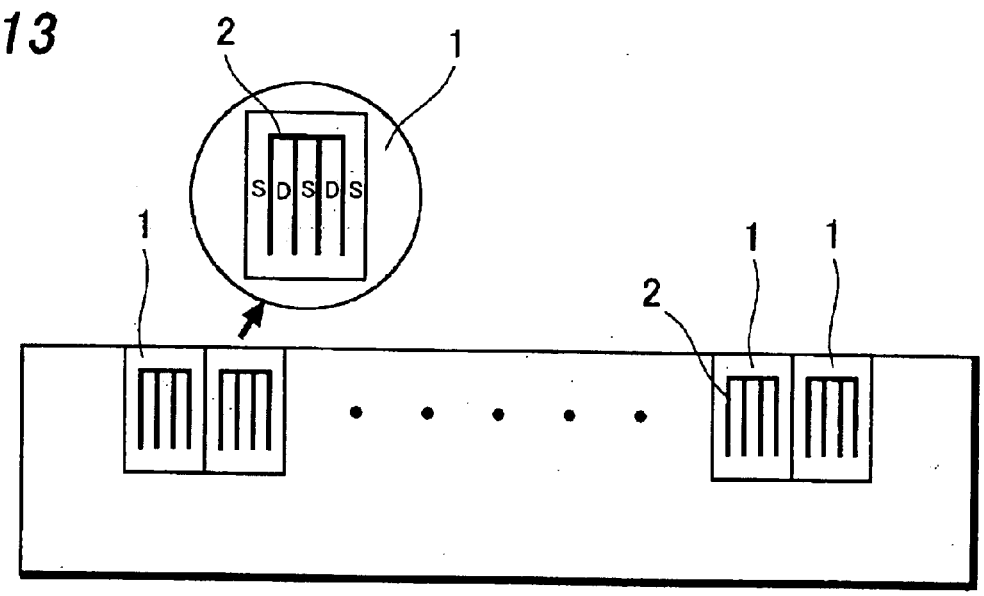
FIG. 13 is a plane view showing a pattern layout of the conventional semiconductor device.

Next, in FIGS. 5A and 5B, using as a mask a resist film having an opening diameter smaller than the mask opening diameter (see FIG. 13) for forming the SLN region 28 and SLP region 29, opposite-conductivity type impurities are ion-implanted to a central area of the SLN region 28 continuing the LN regions 26 and to a central area of the SLP region 29 continuing the LP regions 27, thereby forming a P type body region 32 and an N type body region 33 to respectively separate the SLN region 28 and the SLP region 29. Namely, in a state covering the other region than the region for a P type region by a not-shown resist film, boron difluoride ion, for example, is first ion-implanted to the substrate surface layer at an acceleration voltage of 120 keV and a dose of $5\times10^{12}/cm^2$ thereby forming a P type body region 32. Thereafter, in a state covering the other region than the region for an N type region by a resist film (PR), phosphorus ion, for example, is ion-implanted to the substrate surface layer at an acceleration voltage of 190 keV and a dose of $5\times10^{12}/cm^2$ thereby forming an N type body region 33. Note that the operation processes concerning ion implant shown in FIGS. 3A to 5B may be properly changed in order. The P type body region 32 and the N type body region 33 each will be constituted with a channel in a surface region thereof.

Figure 6A:
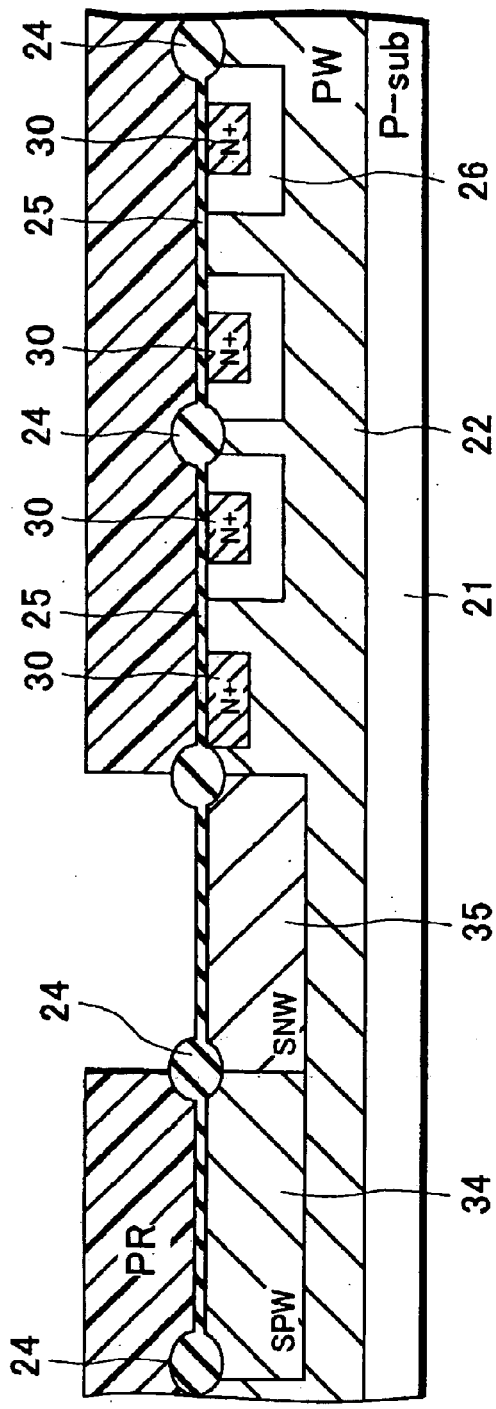
FIGS. 6A and 6B are sectional views showing a method for manufacturing a semiconductor device according to the embodiment of the invention.
Figure 6B:
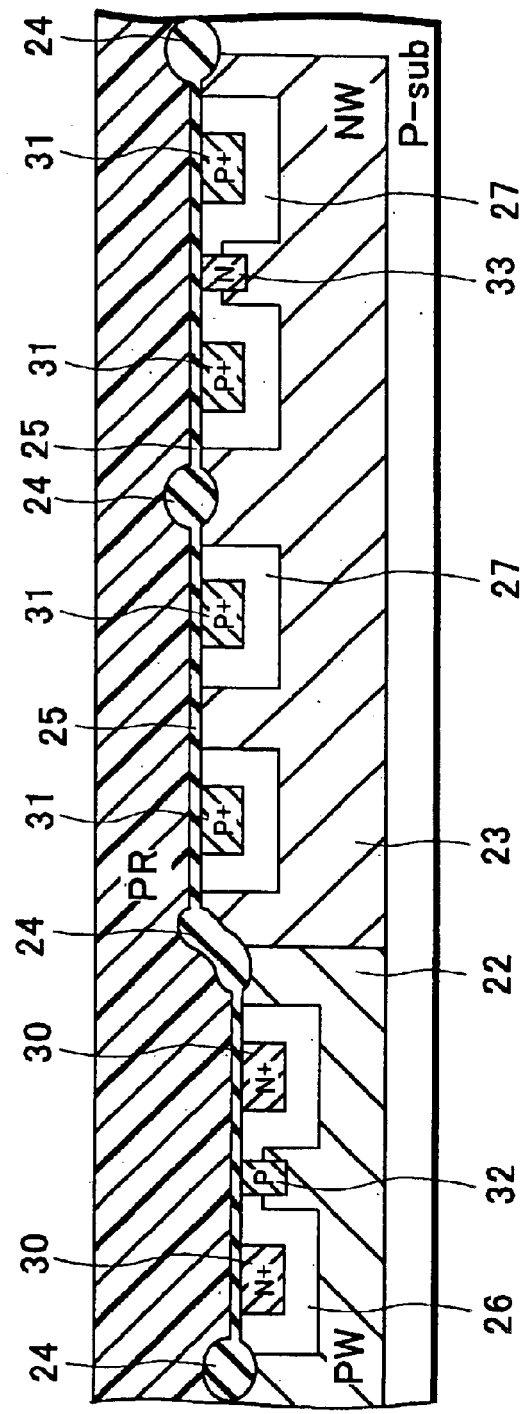

Furthermore, in FIGS. 6A and 6B, a second P type well (SPW) 34 and a second N type well (SNW) 35 are formed in the substrate (P type well 22) at a region for precise N-channel and P-channel MOS normal-voltage transistors.

Namely, using a not-shown resist film having an opening in the region for an N-channel normal-voltage MOS transistor as a mask, boron ion, for example, is ion-implanted to the P type well 22 at an acceleration voltage of approximately 190 keV and a dose of (first implant condition) $1.5\times10^{13}/cm^2$. Thereafter, boron ion is again ion-implanted at an acceleration voltage of approximately 50 keV and a dose of (second implant condition) $2.6\times10^{12}/cm^2$, thus forming a second P type well 34. Also, using a resist film (PR) having an opening in the region for a P-channel normal-voltage MOS transistor as a mask, phosphorous ion, for example, is ion-implanted to the P type well 22 at an acceleration voltage of approximately 380 keV and a dose of $1.5\times10^{13}/cm^2$, thereby forming a second N type well 35. Note that, where a high-acceleration voltage generating apparatus having nearly 380 keV is not available, it is satisfactory to use a double charge scheme for ion-implant two-valence phosphorus ion at an acceleration voltage of approximately 190 keV and a dose of $1.5\times10^{13}/cm^2$. Subsequently, phosphorus ion is ion-implanted at an acceleration voltage of approximately 140 keV and a dose of $4.0\times10^{12}/cm^2$.

Figure 7A:
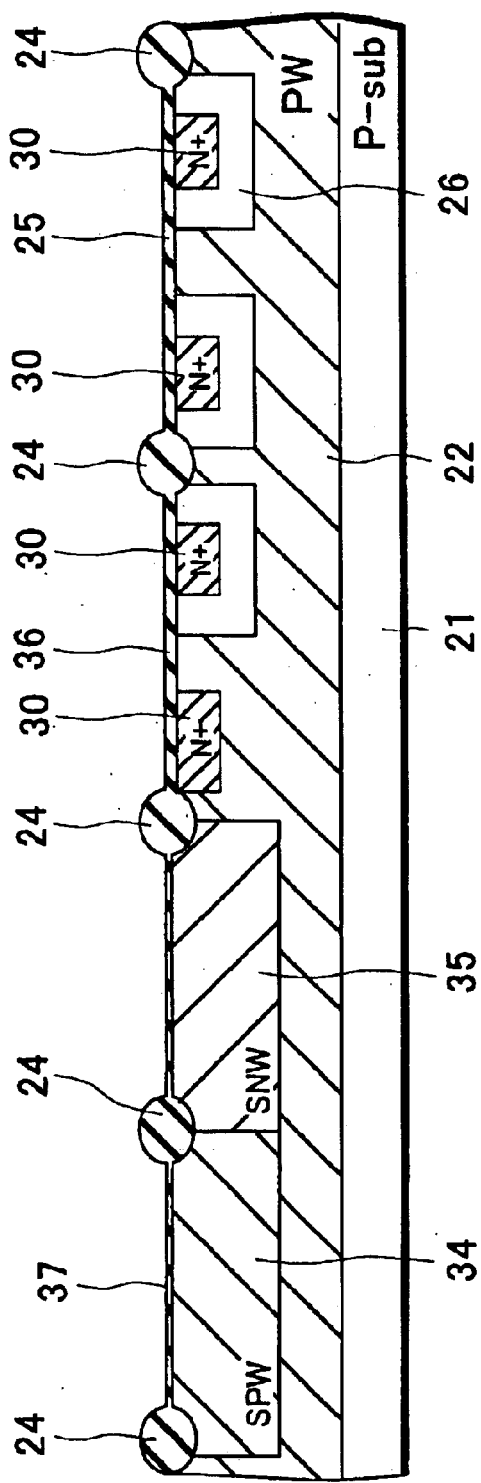
FIGS. 7A and 7B are sectional views showing a method for manufacturing a semiconductor device according to the embodiment of the invention.
Figure 7B:
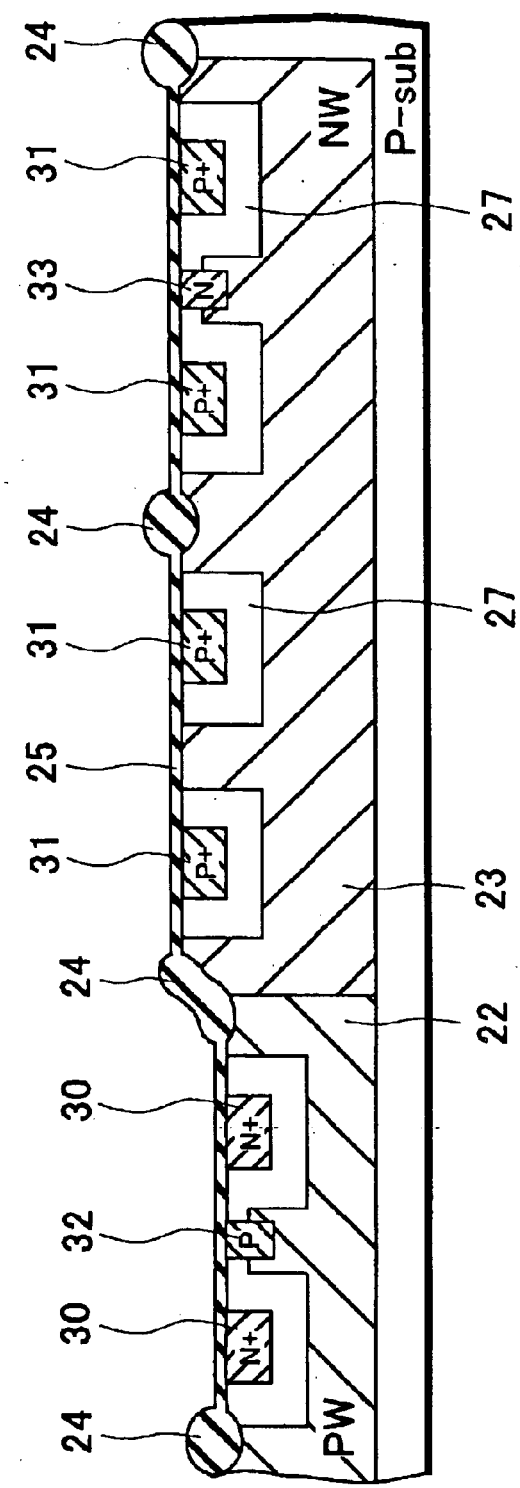

Next, removed is the oxide film 25 from the regions for N-channel and P-channel normal-voltage MOS transistors and for a level-shifter N-channel MOS transistor. Thereafter, as shown in FIGS. 7A and 7B, a gate oxide film having a desired film thickness is newly formed on the above region.

Namely, a gate oxide film 36 is formed on the entire surface by thermal oxidation to approximately 14 nm (approximately 7 nm at this stage, but the film thickness will increase upon forming a gate oxide film for normal voltage referred later) for a level-shifter N-channel MOS transistor. Subsequently, after removing the gate oxide film 36 for a level-shifter N-channel MOS transistor formed on the region for N-channel and P-channel normal-voltage MOS transistors, a thin gate oxide film 37 (approximately 7 nm) for normal voltage is formed on this region by thermal oxidation.

Subsequently, in FIGS. 8A and 8B, a polysilicon film having approximately 100 nm is formed over the entire surface. The polysilicon film is thermally diffused by $POCl_3$ as a thermal-diffusion source thus being made conductive. Thereafter, a tungsten silicide film having approximately 100 nm are formed on the polysilicon film, and further an $SiO_2$ film having approximately 150 nm thereon. Using a not-shown resist film, patterning is made to form gate electrodes 38A, 38B, 38C, 38D, 38E, 38F, 38G for MOS transistors. Note that the $SiO_2$ film serves as a hard mask during the patterning.

Figure 9A:
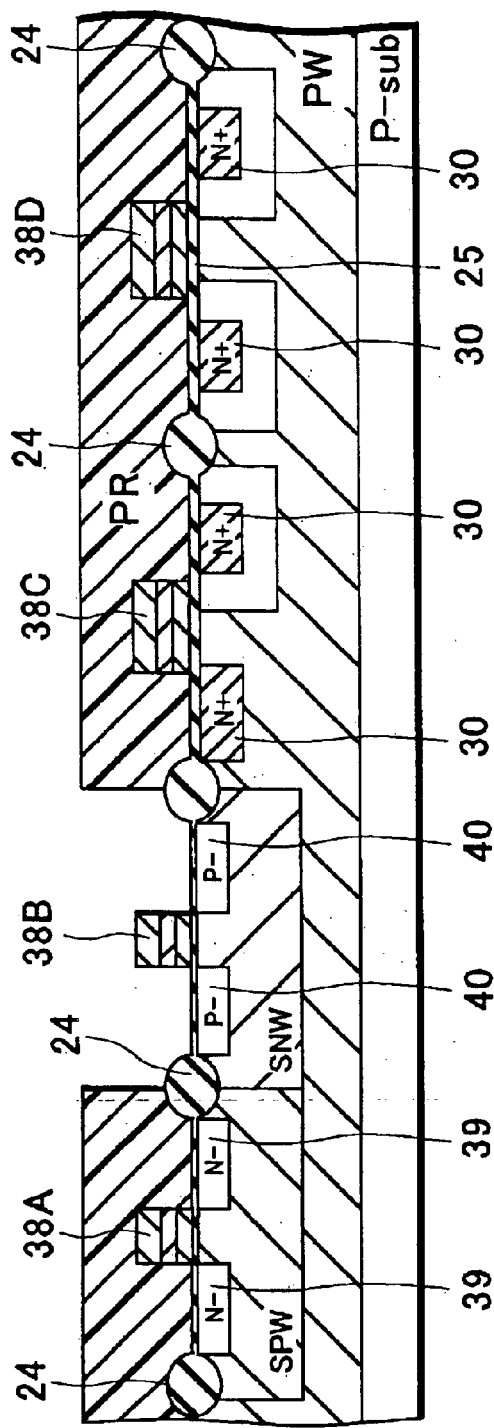
FIGS. 9A and 9B are sectional views showing a method for manufacturing a semiconductor device according to the embodiment of the invention.
Figure 9B:
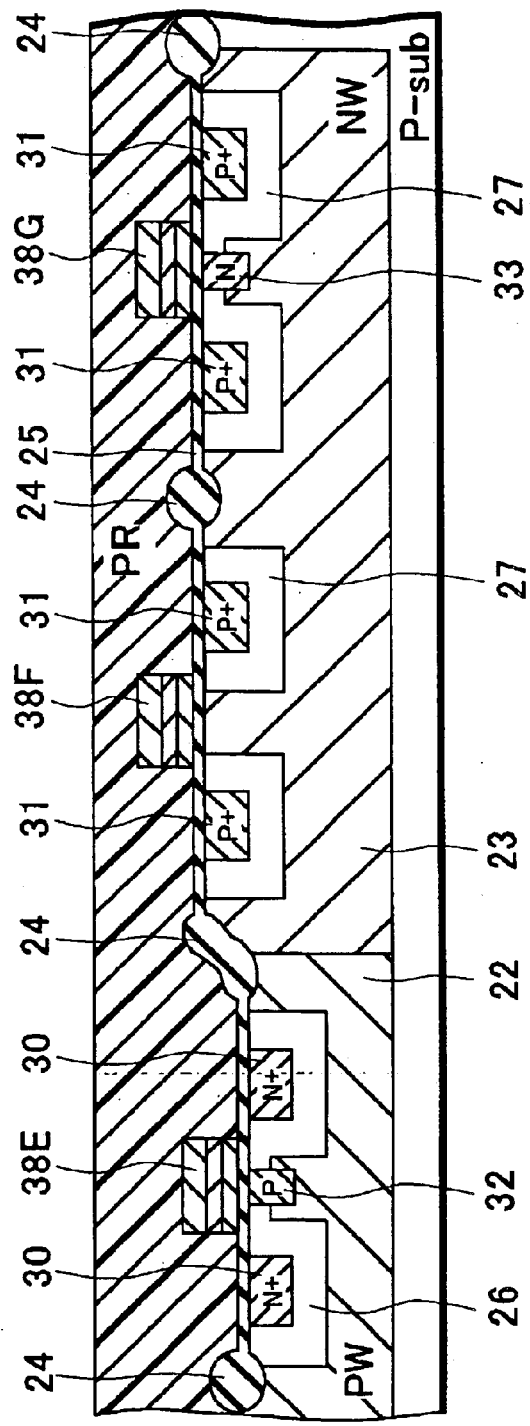

Subsequently, in FIGS. 9A and 9B, low-concentration source/drain regions are formed for normal-voltage N-channel and P-channel MOS transistors.

Namely, using as a mask a not-shown resist film covering the other region than the region for low-concentration source/drain regions for a normal-voltage N-channel MOS transistor, phosphorus ion, for example, is ion-implanted at an acceleration voltage of approximately 20 keV and a dose of $6.2\times10^{13}/cm^2$ to form low-concentration N-type source/drain regions 39. Meanwhile, using as a mask a resist film (PR) covering the other region than the region for a low-concentration source/drain region for a normal-voltage P-channel MOS transistor, boron difluoride ion, for example, is ion-implanted at an acceleration voltage of approximately 20 keV and a dose of $2\times10^{13}/cm^2$ to form low-concentration P-type source/drain regions 40.

Furthermore, as shown in FIGS. 10A and 10B, a TEOS film 41 having approximately 250 nm is formed over the entire surface by the LPCVD process in a manner covering the gate electrodes 38A, 38B, 38C, 38D, 38E, 38F, 38G. The TEOS film 41 is anisotropically etched through a mask of a resist film (PR) having openings in the region for normal-voltage N-channel and P-channel MOS transistors. This forms sidewall spacer films 41A on the sidewalls of the gate electrode 38A, 38B, as shown in FIG. 10A. The TEOS film 41 is left, as it is, in the region covered by the resist film (PR).

Then, using the gate electrode 38A, sidewall spacer films 41A, gate electrode 38B and sidewall spacer films 41A as a mask, high-concentration source/drain regions are formed for normal-voltage N-channel and P-channel MOS transistors.

Namely, using a not-shown resist film covering the other region than the region of high-concentration source/drain regions for a normal-voltage N-channel MOS transistor as a mask, arsenic ion, for example, is ion-implanted at an acceleration voltage of approximately 100 keV and a dose of $5\times10^5/cm^2$ thereby forming high-concentration N+ source/drain regions 42. Also, using a not-shown resist film covering the other region than the region of high-concentration source/drain regions for a normal-voltage P-channel MOS transistor as a mask, boron difluoride ion, for example, is ion-implanted at an acceleration voltage of approximately 40 keV and a dose of $2\times10^{15}/cm^2$ thereby forming high-concentration P+ source/drain regions 43.

An interlayer insulating film, including TEOS and BPSG films, is formed to approximately 600 nm and, thereafter, a metal interconnection layer is formed to have contact to the source/drain regions 30, 31, 42, 43. Thus, completed are normal-voltage N-channel and P-channel MOS transistors, a level-shifter N-channel MOS transistor, high-voltage N-channel and P-channel MOS transistors, and high-voltage N-channel and P-channel SLEDMOS transistors reduced in on-resistance, to constitute the organic EL display driver.

Here, the invention has a feature in the semiconductor device and pattern layout method thereof with the object of designing improvement of precision of finishing shape and working dimension of the each of gate electrode 38A, 38B, 38C, 38D, 38E, 38F, and 38G.

Outline about pattern layout constitution of the invention will be described below using a simplified figure. The description of the constitution similar as the background art (FIG. 13) is simplified adding the same reference numerals to avoid repeated description.

Figure 11A:
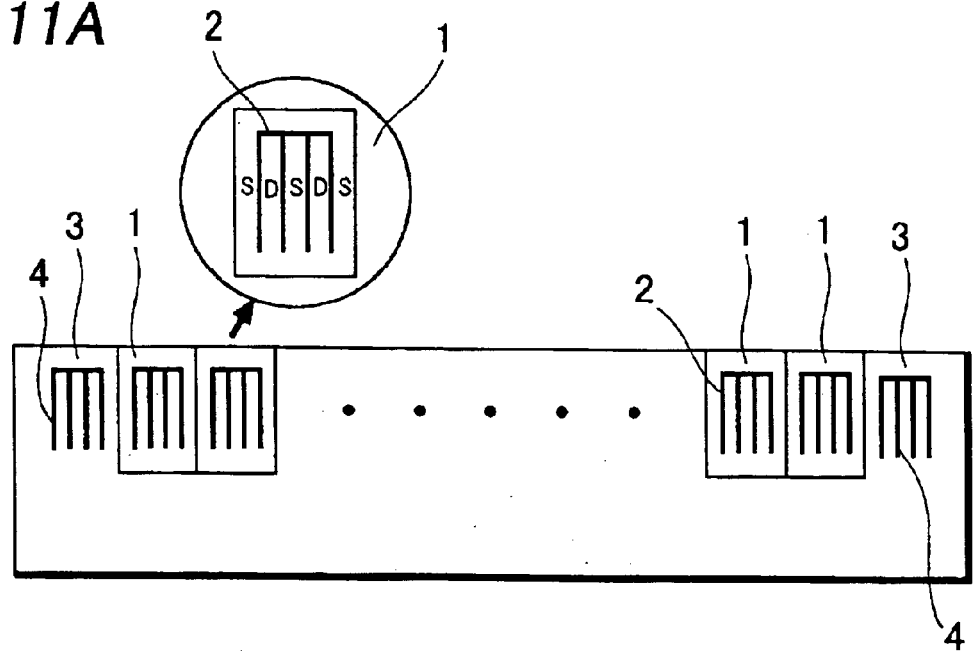
FIGS. 11A to 11D are plane views showing a pattern layout of a semiconductor device according to the embodiment of the invention.

In FIG. 11A, numeral 1 denotes output region corresponding to one bit, and pattern layout of a semiconductor device for various kinds of drivers such as a display driver and the like constitutes desired output bit group by arranging repeatedly the output regions 1 for one bit with times of numbers of required output are arranged to have desired numbers of output.

Numeral 2 denotes wiring for gate electrode formed in the output region 1 for one bit, and source region S and drain region D are formed to be adjacent to the wiring for gate electrode 2. (See enlarged view of the output 1 in the circle in FIGS. 11B to 11D.)

Symbol 3 is a dummy pattern which is a feature of the invention, and the dummy pattern 3 is formed to be adjacent to an end portion of the output bit group where the output region 1 for one bit is arranged repeatedly. In the dummy pattern 3, wiring for the dummy gate electrode 4 having the same shape as the wiring for gate electrode 2 formed in the output region 1 for one bit is formed. Here, source region and drain region corresponding to the wiring for the dummy gate electrode 4 of are not constituted.

Thus in the invention, when pattern layout of output bit group where the output region 1 for one bit is arranged repeatedly as various kinds of drivers such as a display driver and the like is carried out, the dummy pattern 3 having similar layout as the layout of a circuit operating actually is formed to be adjacent to the end portion of the output bit group. Because of that, generation of micro-loading effect at photolithography and etching caused by difference fineness and roughness of the wiring for the gate electrode 2 at pattering the wiring for the gate electrode for example can be depressed. Therefore, uniformity of finishing shape and working dimension of the wiring for the gate electrode 2 improves to reduce difference between outputs.

Figure 11B:
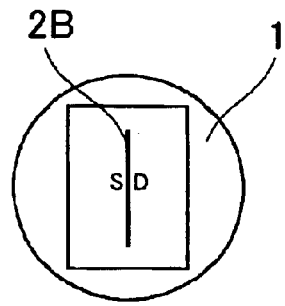
Figure 11C:
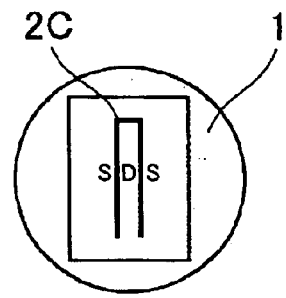
Figure 11D:
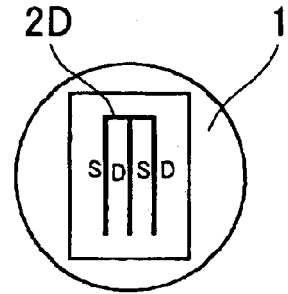

The shape of the wiring for the gate electrode 2 shown in FIG. 11A is only an example, various kinds of the gate electrodes 2B, 2C, and 2D shown in FIGS. 11B, 11C, and 11D may be constituted. Reference S and D show source region and drain region.

Although an example of arranging the dummy pattern 3 having the wiring for the dummy gate electrode 4 corresponding to the wiring for gate electrode 2 is explained in this embodiment, the invention may be arranged with a dummy pattern corresponding to other wiring and field oxide film for separating elements.

Figure 12:
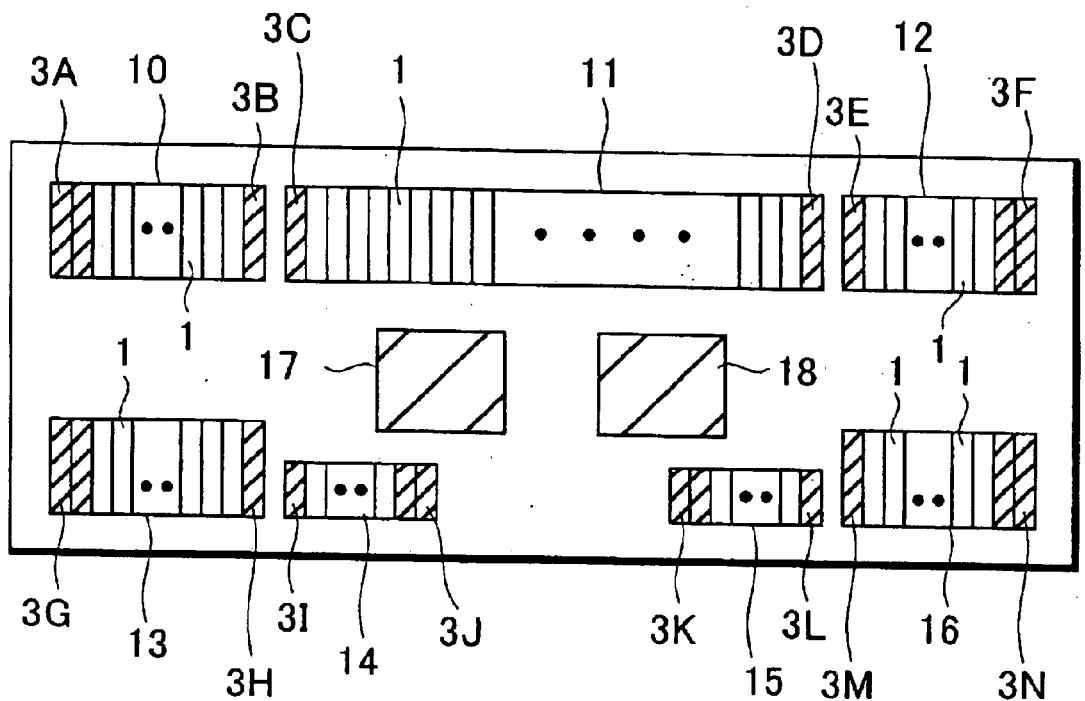
FIG. 12 is a plane view showing a pattern layout of a semiconductor device according to the embodiment of the invention.

FIG. 12 is a view showing pattern layout at applying the invention for a display driver.

Here, as the above-mentioned display driver, there is an organic EL display driver and the like having an anode driver and a cathode driver for example, supplying constant current to an organic EL element (an organic electroluminescent element), and makes the organic EL element emit light. When the organic EL display driver having the anode driver, the cathode driver, a memory, a controller, and the like are made in one chip, each driver portion is mounted mixedly naturally. Therefore, the above-mentioned difference between fineness and roughness of the gate electrode forming pattern becomes large, micro-loading effect generates easily at photolithography and etching, variation of finishing shape and working dimension of the gate electrode caused by the effect becomes large, and problem being out of order in display generates.

Then, in the invention, making the anode driver, the cathode driver, the memory, the controller, and the like in one chip, the following regions are arranged: from upper left of the paper, anode driver region 10 of 32 bits (segment: SEG); cathode driver region 11 of 128 bits (common: COM); and anode driver region 12 of 32 bits (SEG); and from lower left of the paper, anode driver region 13 of 32 bits (SEG); anode driver region 14 for icon of 10 bits (icon SEG); anode driver region 15 for icon of 10 bits (icon SEG); and anode driver region 16 of 32 bits (SEG). Each of driver regions constitutes desired output bit group by arranging repeatedly output region 1 corresponding to one bit output at times of numbers of required outputs.

At one end portion (the end side of the pattern) of the anode driver region 10 of 32 bits (SEG), SEG dummy pattern 3A for 2 bits (two pieces of the output region 1) is arranged, and at another end portion (center side of the pattern), SEG dummy pattern 3B for one bit is arranged. At one end portion (the SEG dummy pattern 3B side) of the cathode driver region 11 of 128 bits (COM), COM dummy pattern 3C for one bit is arranged to be adjacent to the SEG dummy pattern 3B, and even at another end portion, COM dummy pattern 3D for one bit is arranged. Further, at one end portion (the SEG dummy pattern 3D side) of the anode driver region 12 of 32 bits (SEG), SEG dummy pattern 3E for one bit is arranged to be adjacent to the COM dummy pattern 3D, and at another end portion (end side of the pattern), SEG dummy pattern 3F for 2 bits is arranged.

At one end portion (the end side of the pattern) of the anode driver region 13 of 32 bits (SEG), SEG dummy pattern 3G for 2 bits is arranged, and at another end portion (center side At one end portion (the SEG dummy pattern 3H side) of the cathode driver region 14 of 10 bits (icon SEG), icon SEG dummy pattern 3I for one bit is arranged to be adjacent to the SEG dummy pattern 3H, and even at another end portion, icon SEG dummy pattern 3J for 2 bits is arranged. Further, at one end portion (the center side of the pattern) of the anode driver region 15 for icon of 32 bits (icon SEG), icon SEG dummy pattern 3K for 2 bits is arranged, and at another end portion (the anode driver region 16 of 32 bits (SEG) side), icon SEG dummy pattern 3L for one bit is arranged. At one end portion (the SEG dummy pattern 3L side) of the anode driver region 16 of 32 bits (SEG), SEG dummy pattern 3m for one bit is arranged, and at another end portion (the end side of the pattern), SEG dummy pattern 3N for 2 bits is arranged.

Numerals 17 and 18 denote memories arranged at a pattern center portion and memorizing display data and the like.

At this time, working precision is improved by forming a dummy pattern of the same shape as each output bit at the end portion at every each output bit group in this embodiment.

Further, by applying the invention for display driver and the like having an anode driver, a cathode driver, and so on, variation of working precision can be depressed even at making them in one chip. Therefore, michronization and low cost are designed comparing the conventional driver having them separately by making in one chip.

Furthermore, each dummy pattern does not formed evenly (i.e. the same output number), but number of output (one bit in this embodiment) of dummy pattern arranged at the region where adjacent output bit group exists is made less than number of output (2 bits in this embodiment) of the dummy pattern arranged at the region where adjacent output bit group does not exist.

Thus, when output bit group adjacent to end portion of output bit group does not exist, dummy pattern for 2 bits is arranged for example in the invention. When the output bit group adjacent exists, effectual use of pattern is designed without vain increasing of pattern area by arranging dummy pattern for one bit for example at every output bit group adjacent (i.e. joining each dummy pattern formed at every output bit pattern adjacent becomes a pattern for 2 bits). Even in the case that output bit group adjacent exists, dummy pattern of the same number (pattern for 2 bits for example) as in the case that output bit group adjacent does not exist at end portion of the output bit group may be arranged.

Further, if there is an empty space not patterned in region where plural output bit regions are arranged, not only forming the dummy pattern at the end portion of the output bit group, a dummy pattern may be formed in the empty space. Thus in the invention, the dummy pattern may be arranged at desired position with desired rate considering relation of fineness and roughness of working pattern.

Although a driver for driving the organic EL display for display is described as an example in this embodiment, the invention is not limited to this. The invention is applicable to drivers for various kinds of flat panel display such as an LCD, an LED display, an inorganic EL display, a PDP (Plasma Display Panel), an FED (Field Emission Display), and so on for example, and is possible to apply for use that circuits are inserted repeatedly and number of bits is determined as the need arises.

According to the invention, working precision can be improved by forming the dummy pattern at the end portion of the output bit group.

By applying to the display driver having the anode driver, the cathode driver, and the like, it is possible to make them in one chip so that michronization and low cost are designed.

Further, there is not vain increasing of pattern area by arranging number of output of the dummy pattern arranged at region where output bit group adjacent exists less than number of output of the dummy pattern arranged at region where the output bit group adjacent does not exist.

What is claimed is:

1. A semiconductor device comprising:
a substrate;
at least one output bit group, comprising a plurality of first output patterns, provided on the substrate and configured such that each of the first output patterns is continuously arrayed; and
a dummy pattern, comprising at least one second output pattern having the same shape as each of the first output patterns, the dummy pattern provided on the substrate and being adjacent to an end portion of the output bit group.

2. A semiconductor device for a driver comprising:
a substrate;
at least one output bit group, comprising a plurality of first output patterns, provided on the substrate and configured such that each of the first output patterns is continuously arrayed, each of the first output patterns corresponding to one bit; and
a dummy pattern, comprising at least one second output pattern having the same shape as each of the first output patterns, the dummy pattern provided on the substrate and being adjacent to an end portion of the output bit group.

3. The semiconductor device according to claim 2, wherein the dummy pattern and the output bit group is arrayed in a straight line.

4. The semiconductor device according to claim 2, wherein a plurality of the output bit groups are provided on the substrate, and the output groups constitute, respectively, a cathode driver, an anode driver, and an anode driver for icon.

5. The semiconductor device according to claim 2, wherein a number of the second output patterns provided in an area where each of the output bit groups is adjacent to each other is less than a number of the second output patterns provided in an area where each of the output bit groups is not adjacent to each other.

6. The semiconductor device according to claim 2, wherein the second output pattern has the same shape as wiring for a gate electrode.

7. The semiconductor device according to claim 2, wherein each second output pattern has the same two-dimensional shape as the first output patterns when viewed from above.

8. A method for forming a pattern layout of a semiconductor device, comprising:
providing a substrate;
providing on the substrate at least one output bit group comprising a plurality of first output patterns and configured such that each of the first output patterns is continuously arrayed; and
providing on the substrate a dummy pattern comprising at least one second output pattern having the same shape as each of the first output patterns and being adjacent to an end portion of the output bit group.

9. A method for forming a pattern layout of semiconductor device for a driver comprising:
providing a substrate;
providing on the substrate at least one output bit group comprising a plurality of first output patterns and configured such that each of the first output patterns is continuously arrayed, each of the first output patterns corresponding to one bit; and
providing on the substrate a dummy pattern comprising at least one second output pattern having the same shape as each of the first output patterns and being adjacent to an end portion of the output bit group.

10. The method for forming a pattern layout of a semiconductor device for a driver according to claim 9, wherein the dummy pattern and the output bit group is arrayed in a straight line.

11. The method for forming a pattern layout of a semiconductor device for a driver according to claim 9, wherein a plurality of the output bit groups are provided on the substrate, wherein the output groups constitute, respectively, a cathode driver, an anode driver, and an anode driver for icon.

12. The method for forming a pattern layout of a semiconductor device for a driver according to claim 9, wherein a number of the second output patterns provided in an area where each of the output bit groups is adjacent to each other is less than a number of the second output patterns provided in an area where each of the output bit groups is not adjacent to each other.

13. The method for forming a pattern layout of a semiconductor device for a driver according to claim 9, wherein the second output pattern has the same shape as wiring for a gate electrode.

14. The method for forming a pattern layout of a semiconductor device for a driver according to claim 9, wherein each second output pattern has the same two-dimensional shape, when viewed from above, as the first output patterns.

* * * * *